(12) United States Patent
Tsai et al.

(10) Patent No.: US 9,853,100 B1
(45) Date of Patent: Dec. 26, 2017

(54) HIGH VOLTAGE DEVICE AND MANUFACTURING METHOD THEREOF

(71) Applicant: RICHTEK TECHNOLOGY CORPORATION, Zhubei, HsinChu (TW)

(72) Inventors: Tsung-Ying Tsai, Tainan (TW); Kun-Hun You, Hsinchu (TW); Tsung-Yi Huang, Hsinchu (TW)

(73) Assignee: RICHTEK TECHNOLOGY CORPORATION, Zhubei, Hsinchu (TW)

(*) Notice: Subject to any disclaimer, the term of this patent is extended or adjusted under 35 U.S.C. 154(b) by 0 days.

(21) Appl. No.: 15/490,662

(22) Filed: Apr. 18, 2017

(30) Foreign Application Priority Data

Jan. 9, 2017 (TW) .............................. 106100554 A

(51) Int. Cl.
| | |
|---|---|
| *H01L 29/66* | (2006.01) |
| *H01L 29/06* | (2006.01) |
| *H01L 29/78* | (2006.01) |
| *H01L 29/08* | (2006.01) |
| *H01L 29/40* | (2006.01) |
| *H01L 29/423* | (2006.01) |

(52) U.S. Cl.
CPC ........ *H01L 29/063* (2013.01); *H01L 29/0653* (2013.01); *H01L 29/0696* (2013.01); *H01L 29/0882* (2013.01); *H01L 29/402* (2013.01); *H01L 29/42368* (2013.01); *H01L 29/66681* (2013.01); *H01L 29/7816* (2013.01)

(58) Field of Classification Search
CPC .......... H01L 29/66659; H01L 29/7835; H01L 29/0847; H01L 29/42368; H01L 21/266; H01L 21/823412; H01L 21/823418; H01L 21/82385; H01L 21/823857; H01L 27/088; H01L 27/0922; H01L 29/0653; H01L 29/069
See application file for complete search history.

(56) References Cited

U.S. PATENT DOCUMENTS

| | | |
|---|---|---|
| 2012/0286361 A1 | 11/2012 | Huang |
| 2013/0045577 A1 | 2/2013 | Huang et al. |
| 2013/0270634 A1 | 10/2013 | Huang et al. |

*Primary Examiner* — Robert Bachner
(74) *Attorney, Agent, or Firm* — Tung & Associates

(57) ABSTRACT

The present invention provides a high voltage device and manufacturing method thereof. The high voltage device includes: a semiconductor substrate, an isolation structure, a gate, a body region, a well, a source, a drain and a lightly doped diffusion (LDD) region. The isolation structure is formed on an upper surface of the semiconductor substrate, for defining a device region, The LDD region is formed on the well in the device region. In a lateral direction, the LDD region is located between the gate and the drain, and the LDD region is not in direct contact with the drain.

14 Claims, 13 Drawing Sheets

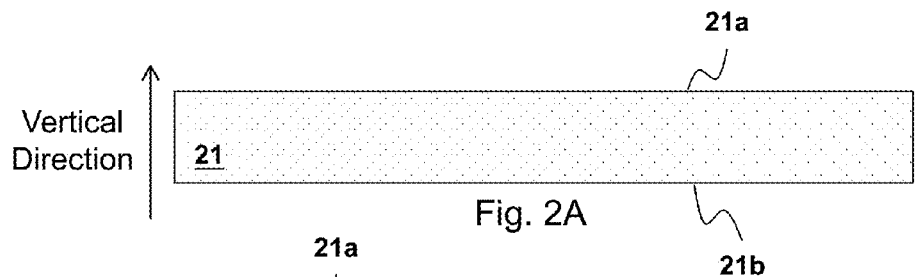
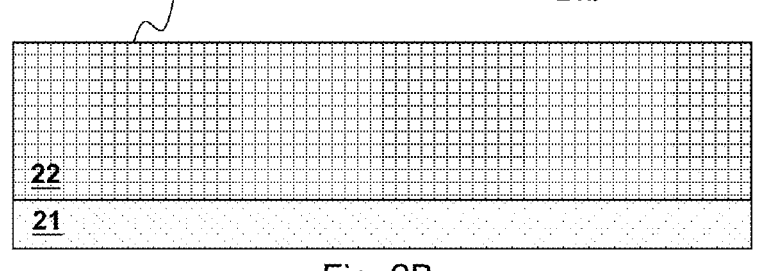
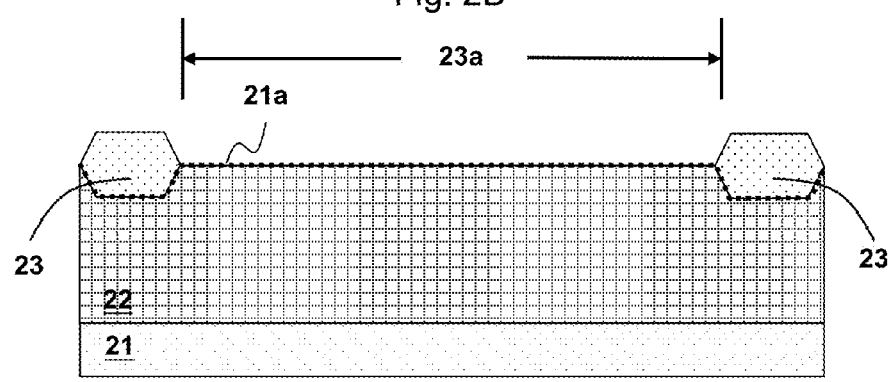
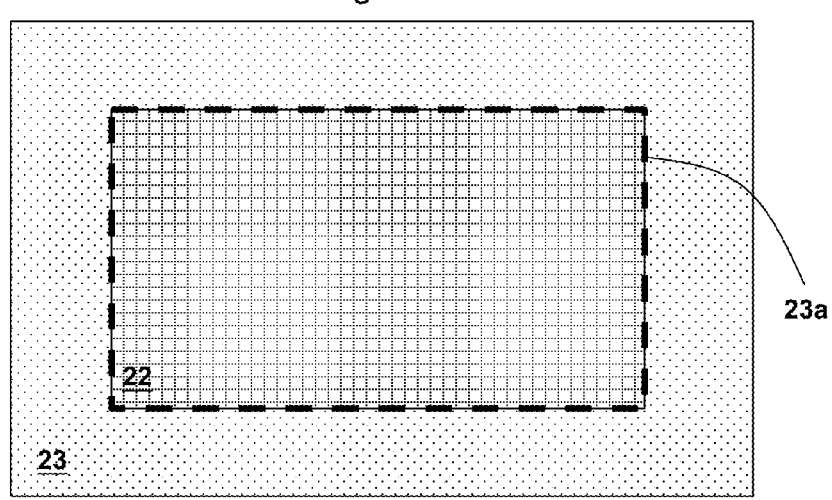

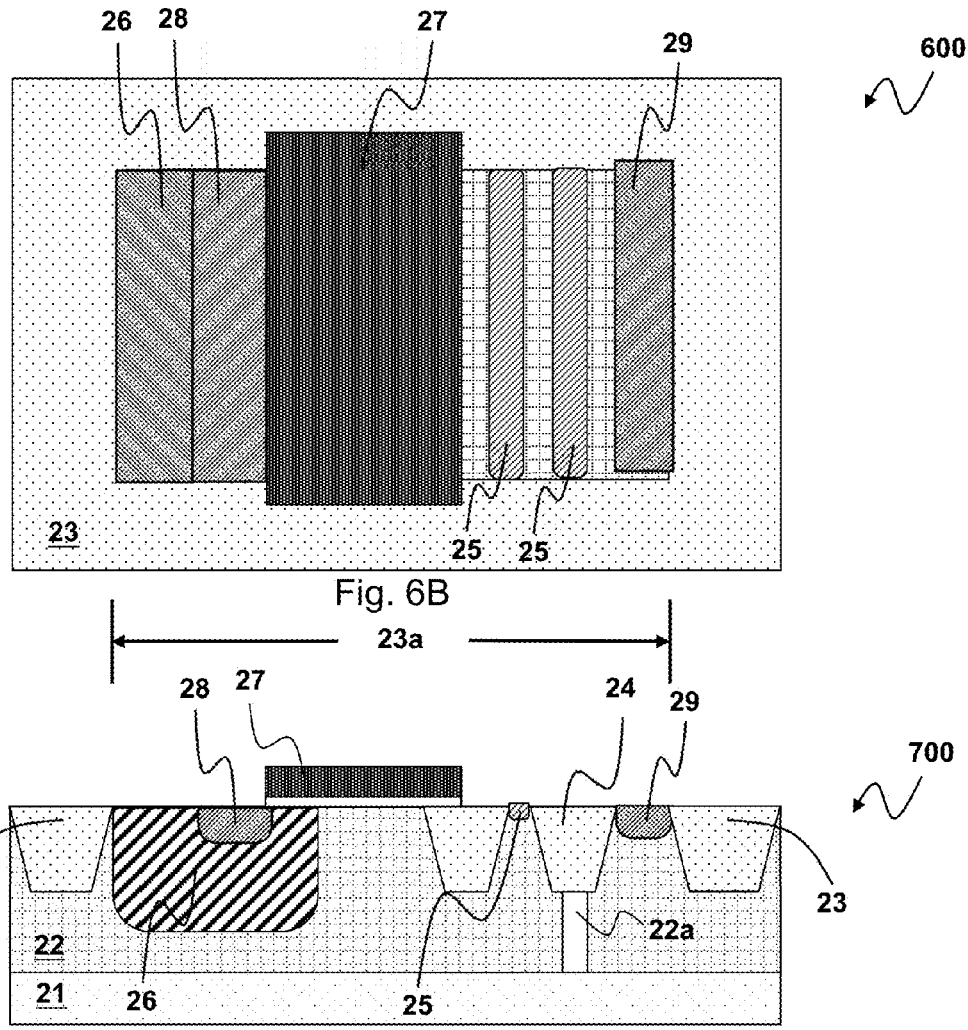
Fig. 6B
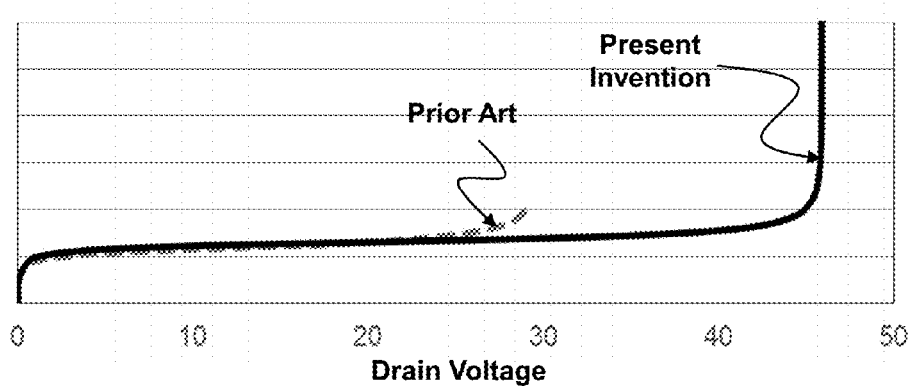
Fig. 7
Fig. 8

HIGH VOLTAGE DEVICE AND MANUFACTURING METHOD THEREOF

CROSS REFERENCE

The present invention claims priority to TW 106100554, filed on Jan. 9, 2017.

BACKGROUND OF THE INVENTION

Field of Invention

The present invention relates to a high voltage device and a manufacturing method thereof; particularly, it relates to such a high voltage device having an increased breakdown voltage in an OFF operation, and a manufacturing method thereof.

Description of Related Art

FIGS. 1A and 1B show schematic diagrams of a cross-sectional view and a top-view respectively of a prior art high voltage device, which is a lateral diffused metal oxide semiconductor (LDMOS) device 100 as shown in the figures. In the context of the present invention, a "high voltage" device indicates a device which needs to withstand a voltage over 5V on a drain thereof in a normal operation. Typically, the high voltage device has a drift region 12a (as indicated by the dashed line shown in FIG. 1A) which separates the drain and a gate of the high voltage device, wherein a lateral length of the drift region is determined according to the threshold voltage that the high voltage device is designed to operate by.

As shown in FIGS. 1A and 1B, the LDMOS device 100 includes: a well 12, an isolation oxide region 13, a field oxide region 14, a body region 16, a gate 17, a source 18, and a drain 19. The well 12 has a conductive type of N-type, and is formed on a substrate 11. The isolation oxide region 13 is a local oxidation of silicon (LOCOS) structure, for defining an device region 13a which is the active area for the operation of the LDMOS device 100. The device region 13a has a range which is indicated by the bold dashed line in FIG. 1B. The gate 17 overlays a part of the field oxidation region 14. The thicknesses of the isolation oxide region 13 and the field oxide region 14 are related to the conduction resistance of the LDMOS device 100, and if these thicknesses are decreased, the conduction resistance of the LDMOS device 100 is decreased. However, the breakdown voltage of the LDMOS device 100 will also be undesirably decreased thereby. On the other hand, if the thicknesses of the isolation oxide region 13 and the field oxide region 14 are increased, the withstand voltage of the LDMOS device 100 is increased. However, the conduction resistance of the LDMOS device 100 will be undesirably increased thereby, and the operation speed is also decreased, to limit the applications of the LDMOS device 100.

In view of above, to overcome the drawbacks in the prior art, the present invention proposes a high voltage device having an increased breakdown voltage in the OFF operation without adversely affecting the conduction resistance, and a manufacturing method thereof.

SUMMARY OF THE INVENTION

In one perspective, the present invention provides a high voltage device. The high voltage device includes: a semiconductor substrate, which includes a top surface and a bottom surface opposite to the top surface in a vertical direction; an isolation structure, which is formed on the top surface of the semiconductor substrate to define a device region; a gate, which is formed on the top surface of the semiconductor substrate in the device region; a body region with a first conductive type, which is formed in the device region beneath the top surface of the semiconductor substrate, and a part of the body region is located right below the gate; a well with a second conductive type, which is formed below the top surface of the semiconductor substrate in the device region, and directly connects the body region in a lateral direction to form a junction, wherein the junction is located right below the gate; a source and a drain, with the second conductive type, which are formed beneath the top surface of the semiconductor substrate in the device region, and are located respectively at two lateral sides of the gate, relatively nearer and farther to the body region respectively, wherein the drain and the gate are separated by the well; and a lightly doped diffusion (LDD) region with the first conductive type, which is formed beneath the top surface above the well in the device region, wherein the LDD region is located between the gate and the drain, and the LDD region is not in direct contact with the drain.

In one perspective, the present invention also provides a manufacturing method of a high voltage device. The manufacturing method includes: providing a semiconductor substrate, which includes a top surface and a bottom surface opposite to the top surface in a vertical direction; forming an isolation structure on the top surface of the semiconductor substrate to define a device region; forming a gate on the top surface of the semiconductor substrate in the device region; forming a body region with a first conductive type, in the device region beneath the top surface of the semiconductor substrate, wherein a part of the body region is located right below the gate; forming a well with a second conductive type, below the top surface of the semiconductor substrate in the device region, which directly connects the body region in a lateral direction to form a junction, wherein the junction is located right below the gate; forming a source and a drain, with the second conductive type, which are formed beneath the top surface of the semiconductor substrate in the device region, and are located respectively at two lateral sides of the gate, relatively nearer and farther to the body region respectively, wherein the drain and the gate are separated by the well; forming a lightly doped diffusion (LDD) region with the first conductive type, which is formed beneath the top surface above the well in the device region, wherein the LDD region is located between the gate and the drain, and the LDD region is not in direct contact with the drain.

In one preferable embodiment, the high voltage device further includes a field oxide region, which is formed on the top surface in the device region, wherein a part of the field oxide region is located right below the gate, and other parts of the field oxide region are located between the gate and the drain.

In one preferable embodiment, two sides of the LDD region in the lateral direction are aligned with the field oxide region.

In the aforementioned embodiment, a depth of the LDD region as measured from the top surface downward along the vertical direction is not deeper than the field oxide region from a cross-sectional view.

In one preferable embodiment, the high voltage device preferably further includes a lightly doped well with the second conductive type, which is formed beneath the top surface in the device region, and two sides of the lightly doped well in the lateral direction are indirect contact with the well, wherein an impurity concentration of the second conductive type of the lightly doped well is lower than an impurity concentration of the second conductive type of the well.

In one preferable embodiment, the LDD region is completely not located right below the gate.

In one preferable embodiment, the LDD region is floating in an ON operation and an OFF operation of the high voltage device.

The objectives, technical details, features, and effects of the present invention will be better understood with regard to the detailed description of the embodiments below.

BRIEF DESCRIPTION OF THE DRAWINGS

FIGS. 2A-2I show a first embodiment of the present invention.

FIGS. 6A and 6B show a fifth embodiment of the present invention.

FIG. 7 shows a sixth embodiment of the present invention.

FIG. 8 shows a schematic diagram of the characteristics of the prior art high voltage device and the present invention, which indicates that the breakdown voltage of the high voltage device according to the present invention is relatively higher.

DESCRIPTION OF THE PREFERRED EMBODIMENTS

The drawings as referred to throughout the description of the present invention are for illustration only, to show the interrelations between the regions and the process steps, but not drawn according to actual scale.

Figure 1A:
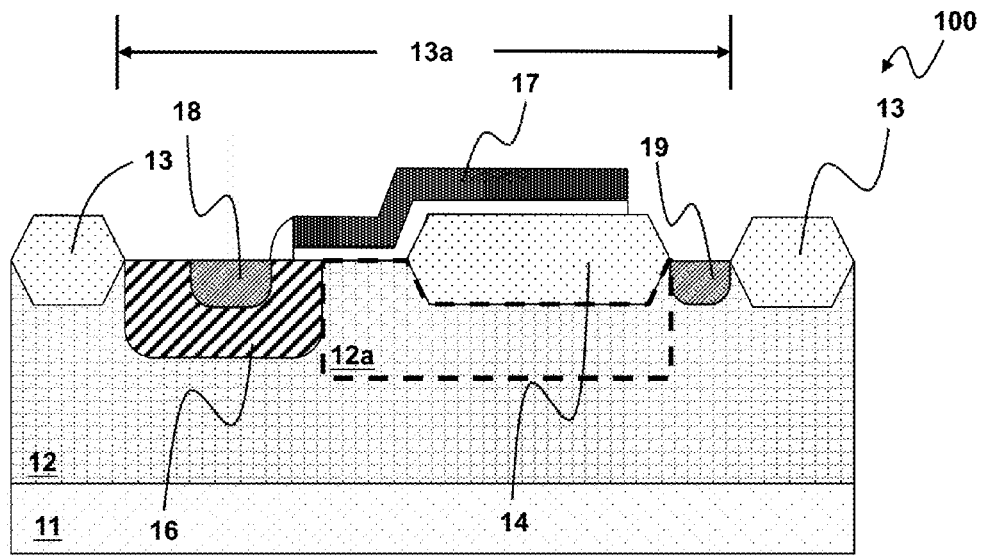
FIGS. 1A and 1B show schematic diagrams of a cross-sectional view and a top view of a prior art high voltage device 100, respectively.
Figure 1B:
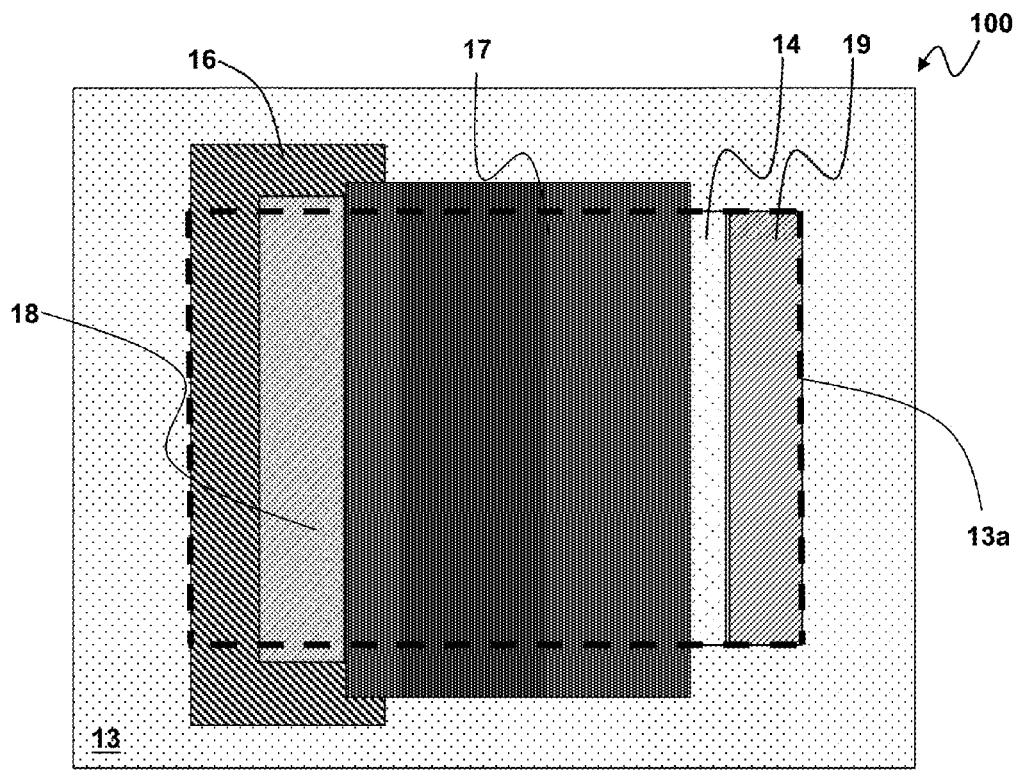
Figure 2E:
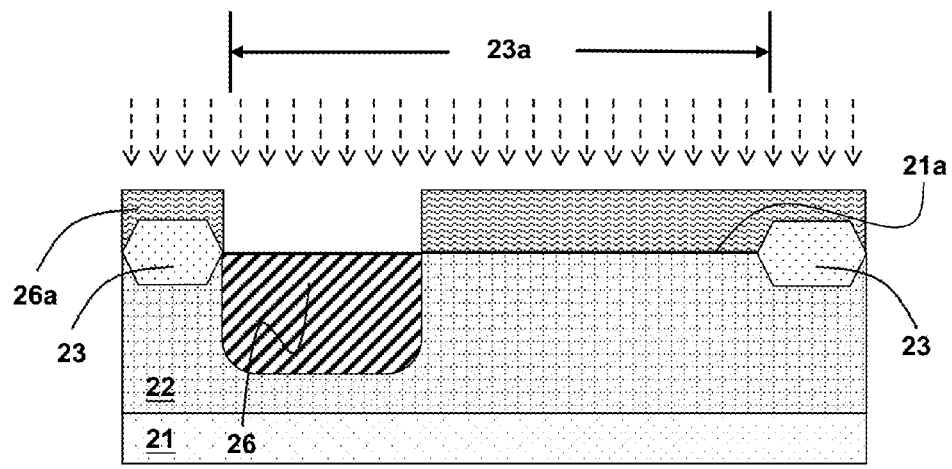

Please refer to FIGS. 2A-2I for a first embodiment according to the present invention. As shown in FIG. 2A, first, a semiconductor substrate 21 is provided, which is for example but not limited to a P-type silicon substrate. As shown in FIG. 2A, the semiconductor substrate 21 includes a top surface 21a and a bottom surface 21b opposite to the top surface 21a in a vertical direction (the vertical direction is indicated by a solid arrow shown in the figure). Next, as shown in FIG. 2B, a well 22 is formed below the top surface 21a of the semiconductor substrate 21. The well 22 is for example but not limited to N-type. Next, as shown in FIG. 2C, an isolation structure 23 is formed on the top surface 21a of the semiconductor substrate 21 to define a device region 23a, wherein, because of the formation of the isolation structure 23, the top surface 21a becomes the dashed line shown in the figure. In this embodiment, the isolation structure 23 is for example but not limited to a local oxidation of silicon (LOCOS) structure. In another embodiment, the isolation structure 23 may be embodied in other forms, for example but not limited to a shallow trench isolation (STI) structure.

FIG. 2D shows a schematic diagram of a top view corresponding to the cross-sectional view shown in FIG. 2C. As shown in the figure, the isolation structure 23 is for example but not limited to a ring-shaped structure, defining the device region 23a inside the ring-shaped structure. Next, as shown in FIG. 2E, a body region 26 is formed in the device region 23a below the top surface 21a of the semiconductor substrate 21. The body region 26 may be formed by implanting P-type impurities into a defined region in the device region 23a by an ion implantation process, as indicated by dashed arrows shown in the figure, wherein the defined region is defined by a mask formed by a photo-resist layer 26a.

Figure 2F:
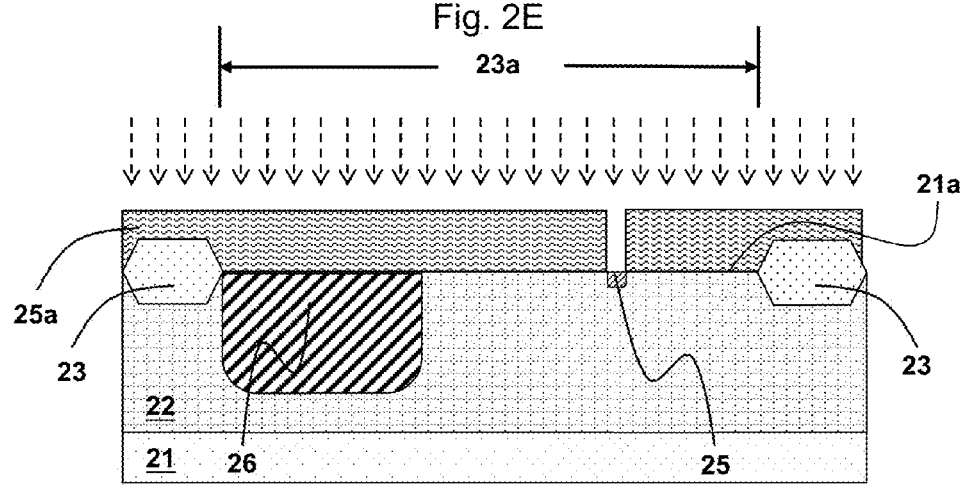

Next, as shown in FIG. 2F, an LDD region 25 is formed in the device region 23a beneath the top surface 21a of the semiconductor substrate 21. The LDD region 25 may be formed by implanting P-type impurities into a defined region in the device region 23a by anion implantation process as indicated by dashed arrows shown in the figure, wherein the defined region is defined by a mask formed by a photo-resist layer 25a.

Figure 2G:
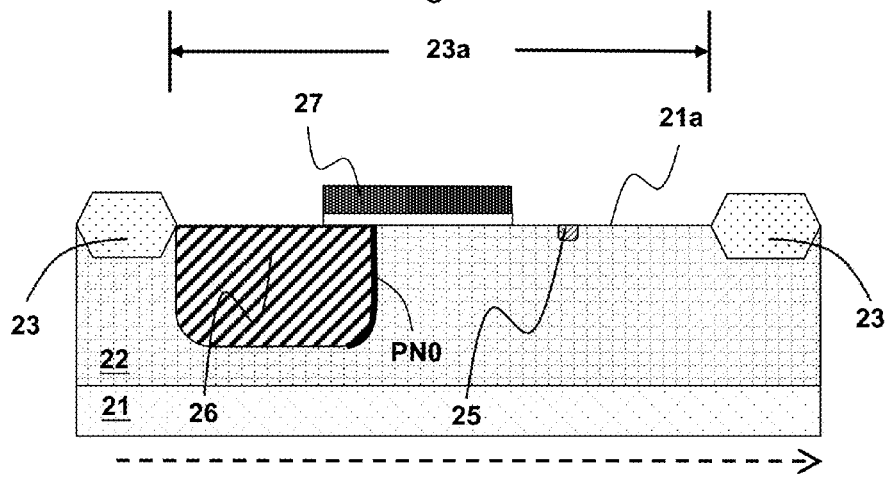

Next, as shown in FIG. 2G, a gate 27 is formed on the top surface 21a of the semiconductor substrate 21 in the device region 23a. As shown in the figure, a part of the body region 26 is located right below the gate 27. Note that the well 22 in the device region 23a directly connects the body region 26 in a lateral direction (the lateral direction is indicated by a dashed arrow in the figure), thereby forming a PN junction PN0 right below the gate 27.

Figure 2H:
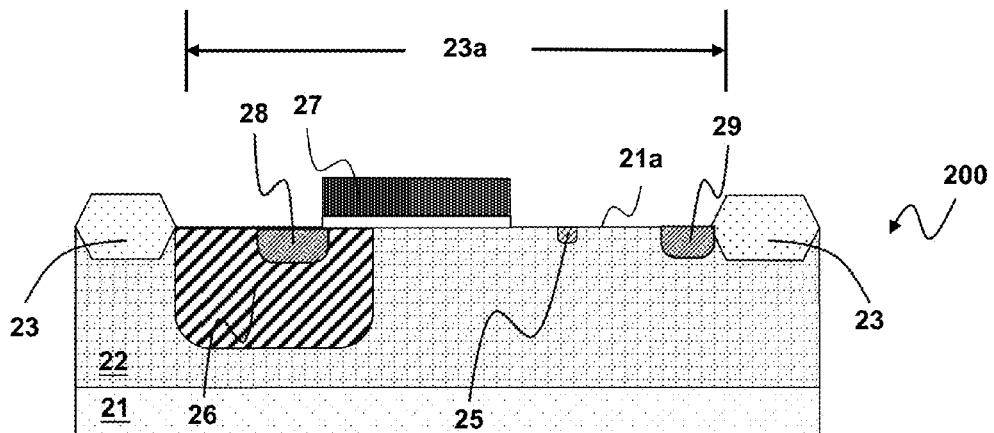

Next, as shown in FIG. 2H, a source 28 and a drain 29 are formed beneath the top surface 21a of the semiconductor substrate 21 in the device region 23a, and are located respectively at two sides of the gate 27, relatively nearer and farther to the body region 26 respectively, wherein the drain 29 and the gate 27 are separated by the well 22. The source 28 and the drain 29 have for example but not limited to N-type conductive type. The source 28 and the drain 29 may be formed by implanting N-type impurities, with for example but not limited to an ion implantation process, into defined regions beneath the top surface 21a in the device region 23a of the semiconductor substrate 21, wherein the defined regions for example can be defined by a photo-resist layer formed by a lithography process, or by a photo-resist layer together with the isolation structure 23 and the gate 27.

Figure 2I:
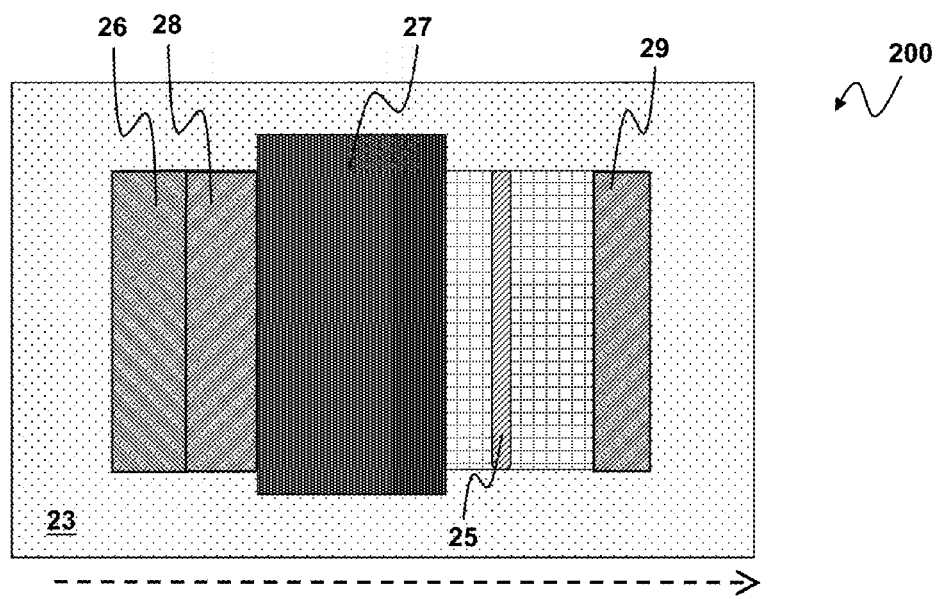

FIG. 2I shows a schematic diagram of a top view corresponding to the cross-sectional view shown in FIG. 2H. As shown in FIG. 2I, the LDD region 25 is located between the gate 27 and the drain 29, and the LDD region 25 is not indirect contact with the drain 29. The LDD region 25 has for example but not limited to P-type conductive type.

The present invention is different from the prior art in that, in the present invention, the LDD region 25 is isolatedly formed between the body region 26 and the drain 29 beneath the top surface 21a, thereby forming a relatively larger depletion region in an OFF operation of the high voltage device 200, to reduce an electric field applied to the high voltage device 200. By this arrangement, that the high voltage device 200 can withstand a relatively higher voltage applied thereto, i.e., a breakdown voltage in the OFF operation of the high voltage device 200 is increased.

The present invention is not limited to the N-type device as shown by the embodiment in FIGS. 2A-2I. The same spirit is also applicable to a P-type device with corresponding modifications on the conductive types and impurity concentrations of the doped regions.

Please refer to FIGS. 3A-3I for a second embodiment according to the present invention. Similarly to the first embodiment, this embodiment is illustrative with an N-type high voltage device as an example.

This embodiment is similar to the first embodiment in the structure and manufacturing process steps, but is different from the first embodiment in that, first, in this embodiment, the high voltage device 300 further includes a field oxide region 24. Second, in the manufacturing process of the first embodiment, the LDD region 25 is defined by a photo-resist layer formed in a lithography process independently and different from the lithography process for defining the well 22 (FIG. 2F); in this embodiment, the LDD region 25 is defined by the same manner as the well 22.

Figure 3A:
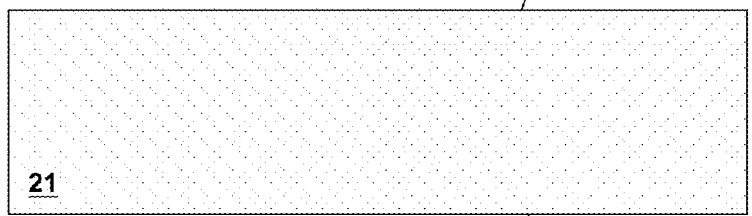
FIGS. 3A-3I show a second embodiment of the present invention.
Figure 3B:
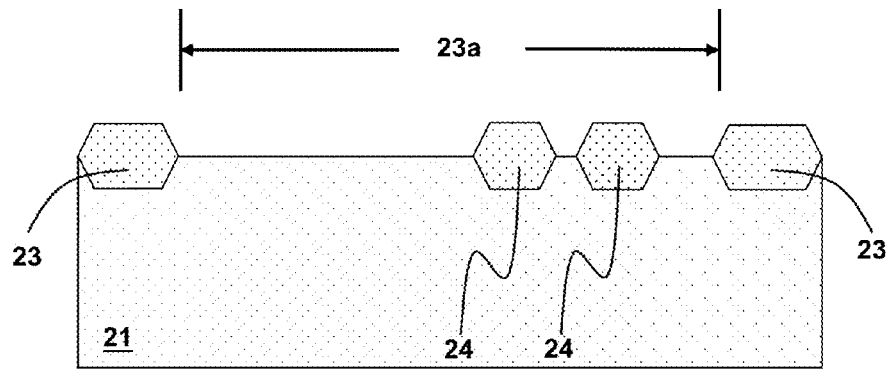

As shown in FIG. 3A, first, a semiconductor substrate 21 is provided, which is for example but not limited to the P-type silicon substrate. As shown in FIG. 3A, the semiconductor substrate 21 includes a top surface 21a and a bottom surface 21b opposite to the top surface 21a in a vertical direction (the vertical direction is indicated by a solid arrow shown in the figure). Next, as shown in FIG. 3B, in for example but not limited to a same process step, the isolation structure 23 and the field oxide region 24 are formed on the top surface 21a of the semiconductor substrate 21. In this embodiment, the field oxide region 24 includes two separate areas, but in another embodiment, the field oxide region 24 can be one connected region having an O-shape, a B-shape, etc. The isolation structure 23 defines the device region 23a. The field oxide region 24 is formed on the top surface 21a in the device region 23a, and a part of the field oxide region 24 is located right below a gate 27 formed in a later process (FIG. 3D), while other parts of the field oxide region 24 are located between the gate 27 and a drain 29 formed in a later process (FIG. 3H). Note that, the field oxide region 24 defines the LDD region 25 which is to be formed in a later process (FIG. 3F). In this embodiment, the isolation structure 23 is for example but not limited to the LOCOS structure. In another embodiment, the isolation structure 23 may be embodied in other forms, for example but not limited to the STI structure.

Figure 3C:
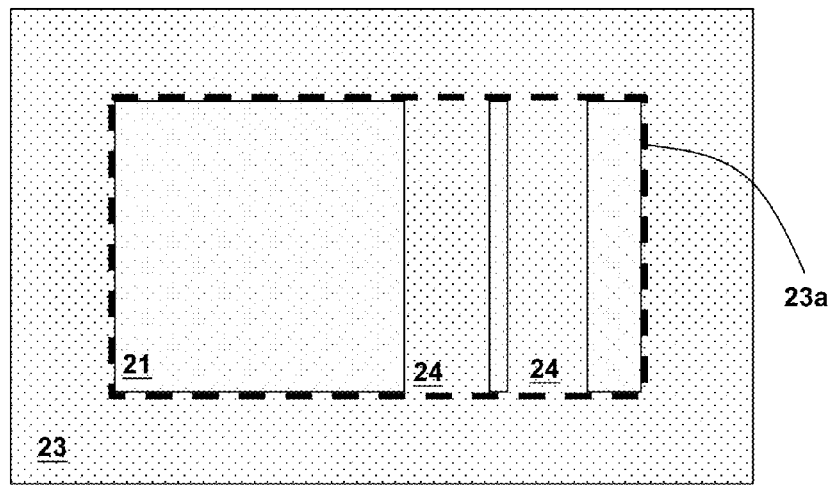

FIG. 3C shows a schematic diagram of a top view corresponding to a cross-sectional view shown in FIG. 3B. As shown in the figure, the isolation structure 23 is for example but not limited to a ring-shaped structure, defining the device region 23a inside the ring-shaped structure, and the field oxide region 24 defines an opening within it.

Figure 3D:
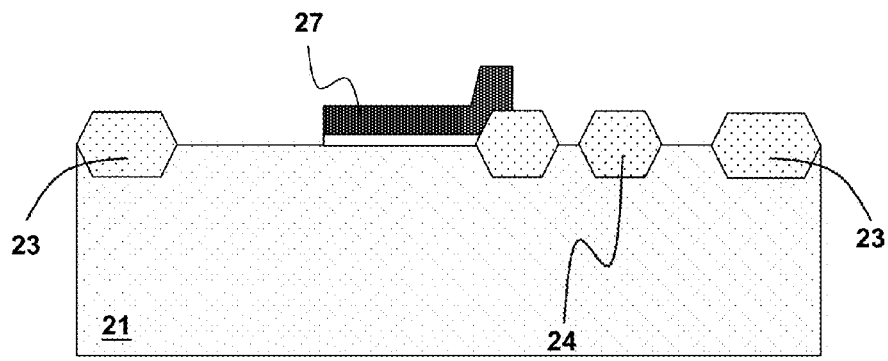

Next, as shown in FIG. 3D, the gate 27 is formed on the top surface 21a of the semiconductor substrate 21 in the device region 23a. As shown in the figure, a part of the field oxide region 24 is located right below the gate 27, while other parts of the field oxide region 24 are located between the gate 27 and the drain 29 formed in a later process (FIG. 3H).

Figure 3E:
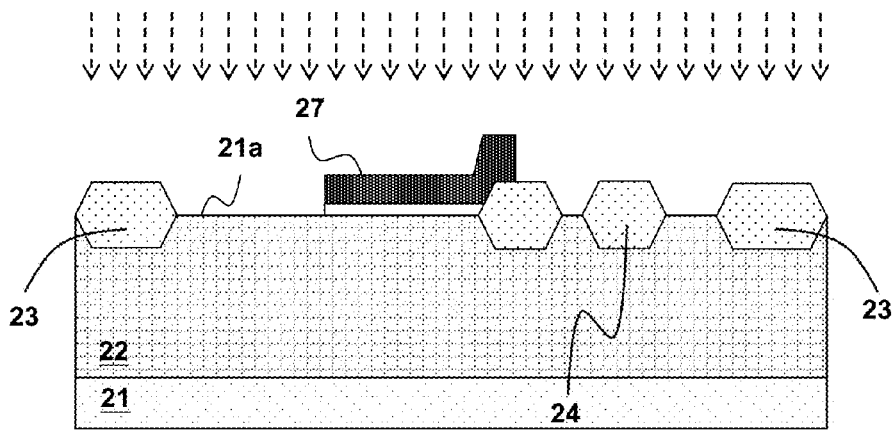
Figure 3F:
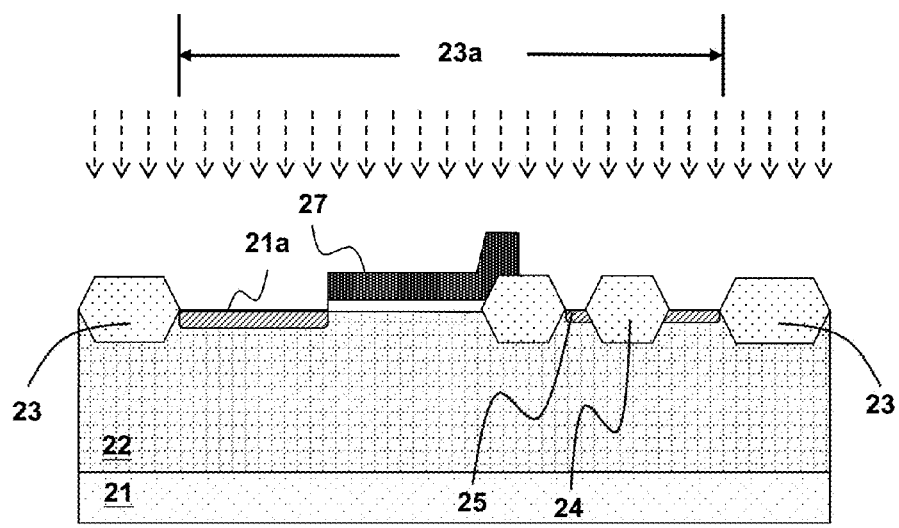

Next, as shown in FIG. 3E, a well 22 is formed below the top surface 21a of the semiconductor substrate 21. The well 22 is for example but not limited to N-type. Next, as shown in FIG. 3F, the LDD region 25 is formed in the device region 23a beneath the top surface 21a of the semiconductor substrate 21. The LDD region 25 may be formed by implanting P-type impurities into a defined region in the device region 23a by an ion implantation process as indicated by dashed arrows shown in the figure, wherein the defined region is defined by the field oxide region 24. That is, no additional lithography process is required for forming LDD region 25; the LDD region 25 can be formed by the same mask as the well 22. The mask for example can be a self-aligned mask formed by the gate 27, the isolation structure 23, and the field oxide region 24; or, a photo-resist layer (not shown) may be used if required. Because the P-type impurity concentration of the LDD region 25 is far lower than N-type impurity concentrations of the source 28 and the drain 29, as shown in the figure, the P-type impurities implanted to the regions where the source 28 and the drain 29 are to be formed later, are ignorable with respect to the primary performance of the device.

Figure 3G:
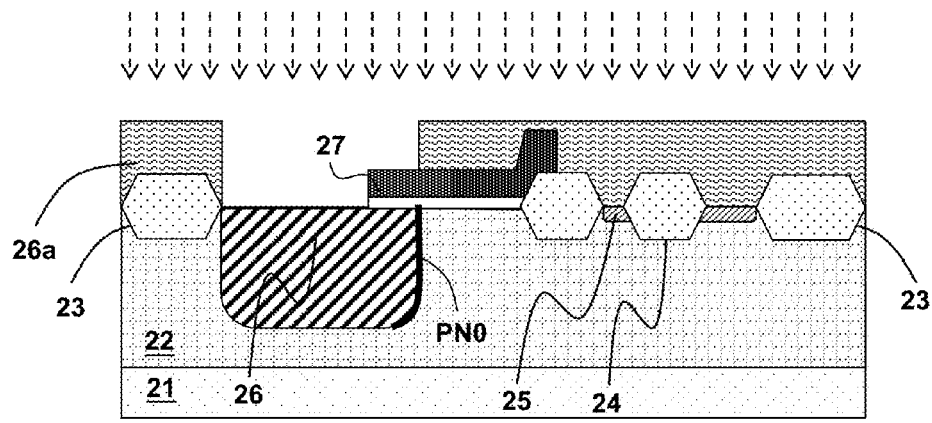
Figure 3H:
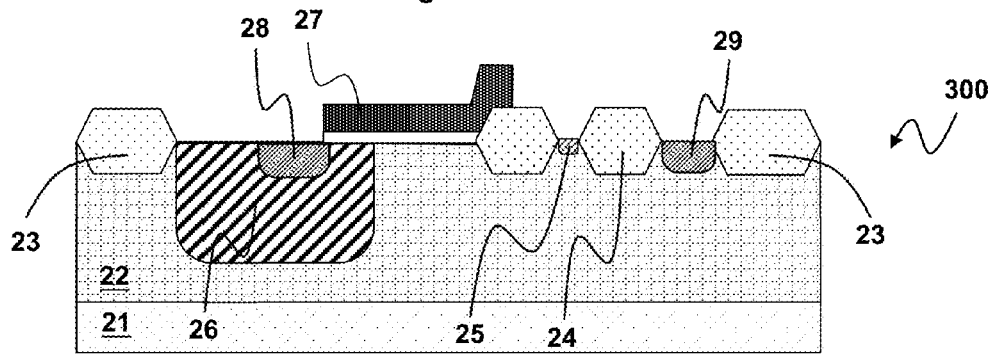

Next, as shown in FIG. 3G, a body region 26 is formed in the device region 23a beneath the top surface 21a of the semiconductor substrate 21. The body region 26 may be formed by implanting P-type impurities into a defined region in the device region 23a by anion implantation process as indicated by dashed arrows shown in the figure, wherein the defined region is defined by a mask formed by a photo-resist layer 26a. As shown in the figure, a part of the body region 26 is located right below the gate 27. Note that the well 22 in the device region 23a directly connects the body region 26 in a lateral direction (the lateral direction is indicated by a dashed arrow in the figure), thereby forming a PN junction PN0 right below the gate 27.

Next, as shown in FIG. 3H, the source 28 and the drain 29 are formed beneath the top surface 21a of the semiconductor substrate 21 in the device region 23a, and are located respectively at two sides of the gate 27, relatively nearer and farther to the body region 26 respectively, wherein the drain 29 and the gate 27 are separated by the well 22. The source 28 and the drain 29 have for example but not limited to N-type conductive type. The source 28 and the drain 29 may be formed by implanting N-type impurities, with for example but not limited to an ion implantation process, into a defined region beneath the top surface 21a in the device region 23a of the semiconductor substrate 21, wherein the defined regions for example can be defined by a photo-resist layer formed by a lithography process, or by a photo-resist layer together with the isolation structure 23, the field oxide region 24 and the gate 27.

Figure 3I:
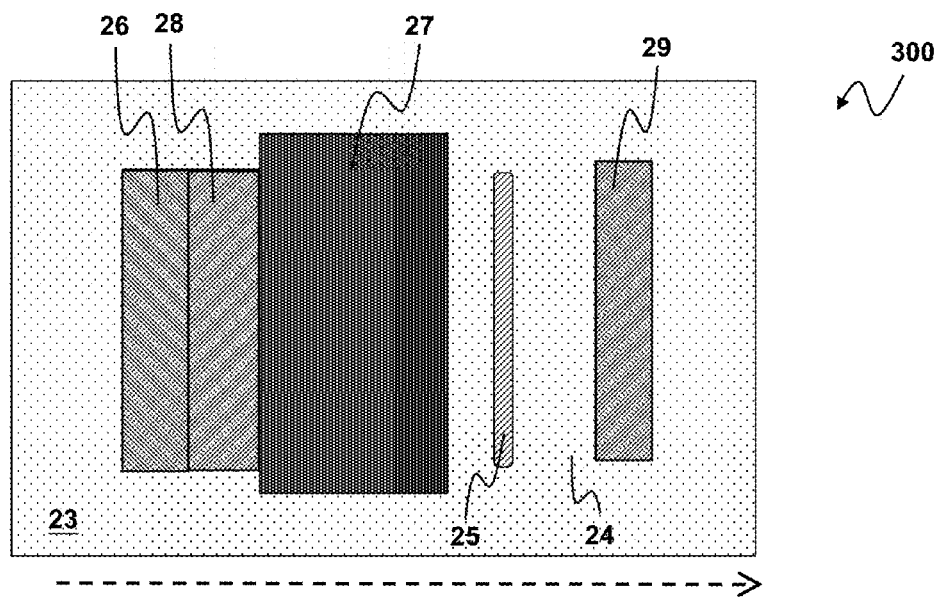
Figure 4A:
FIGS. 4A-4I show a third embodiment of the present invention.
Figure 4B:
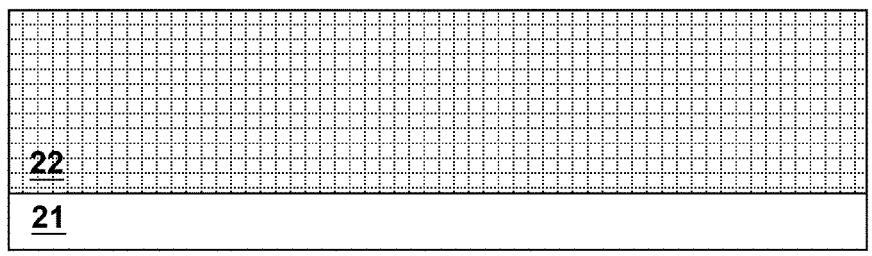
Figure 4C:
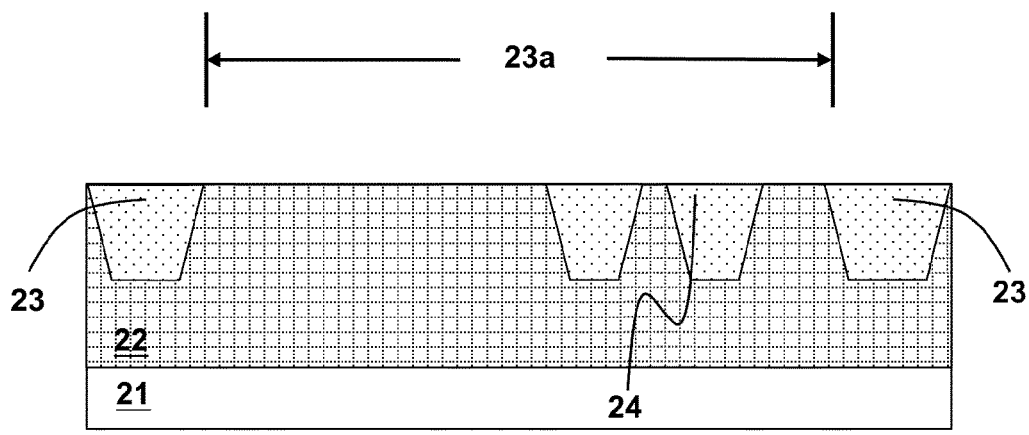
Figure 4D:
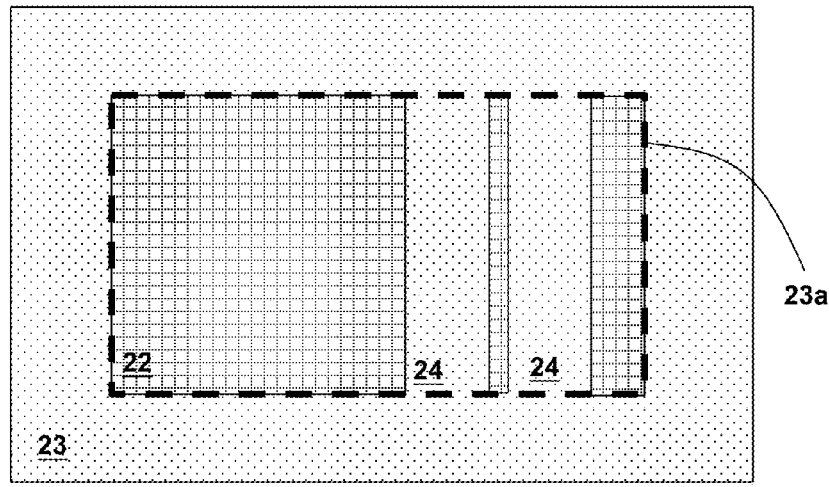
Figure 4E:
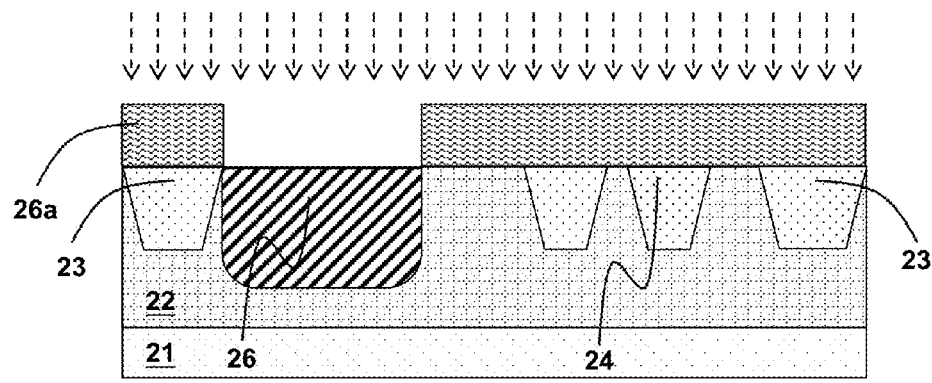
Figure 4F:
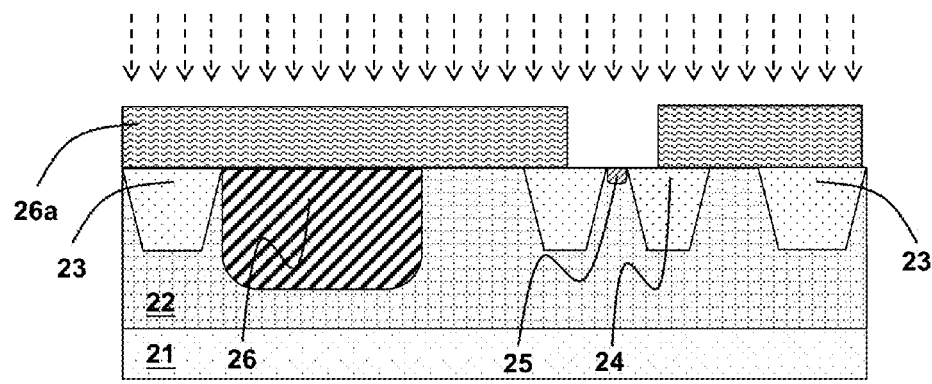
Figure 4G:
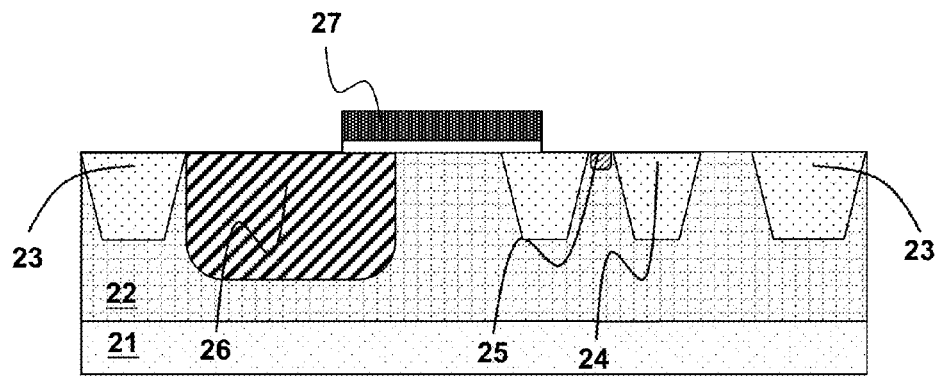
Figure 4H:
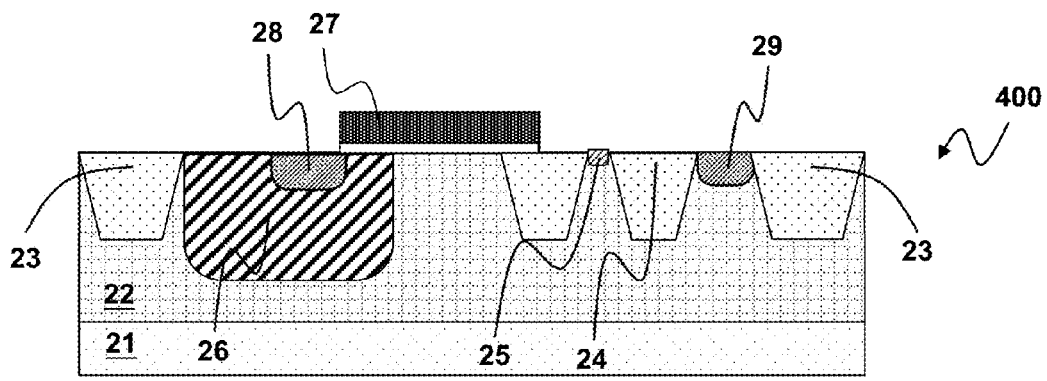
Figure 4I:
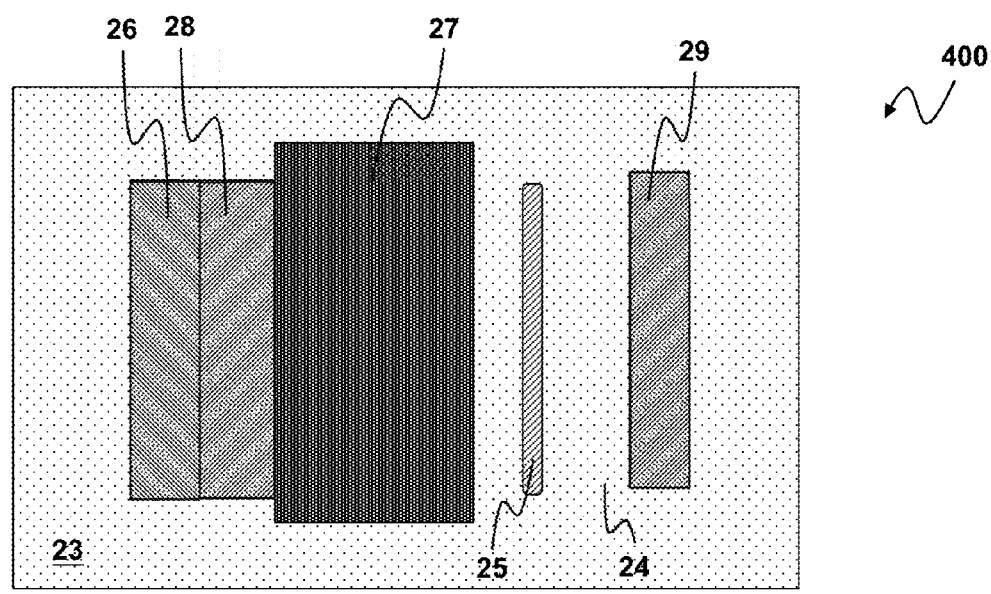

FIG. 3I shows a schematic diagram of a top view corresponding to a cross-sectional view shown in FIG. 3H. As shown in FIG. 3I, the LDD region 25 has for example but not limited to P-type conductive type. The LDD region 25 is located between the gate 27 and the drain 29, and the LDD region 25 is not in direct contact with the drain 29. Besides, note that this embodiment is different from the first embodiment in addition to the aforementioned difference. As shown in FIGS. 3H and 3I, two lateral sides of the LDD region 25 (two sides in the lateral direction) are aligned with the field oxide region 24. Besides, the depth of the LDD region 25 as measured from the top surface 21a downward along the vertical direction is not deeper than the field oxide region 24, as seen from the cross-sectional view as shown in FIG. 3I.

The present invention is not limited to the N-type device as shown by the embodiment in FIGS. 3A-3I. The same spirit is also applicable to a P-type device with corresponding modifications on the conductive types and impurity concentrations of the doped regions.

Please refer to FIGS. 4A-4I for a third embodiment according to the present invention. Similarly to the first embodiment, this embodiment is illustrative with an N-type high voltage device as an example.

This embodiment is similar to the second embodiment in the structure and manufacturing process steps, but is different from the second embodiment in that, in this embodiment, the isolation structure 23 and the field oxide region 24 of the high voltage device 400 are STI structures. This embodiment shows that the isolation structure 23 and the field oxide region 24 according to the present invention may be STI structures. Other manufacturing process steps of this embodiment are the same as the second embodiment, and details thereof are omitted here.

Figure 5A:
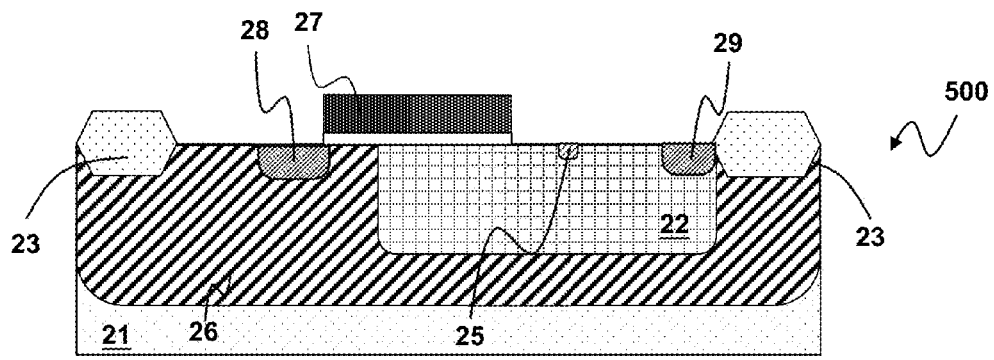
FIGS. 5A and 5B show a fourth embodiment of the present invention.
Figure 5B:
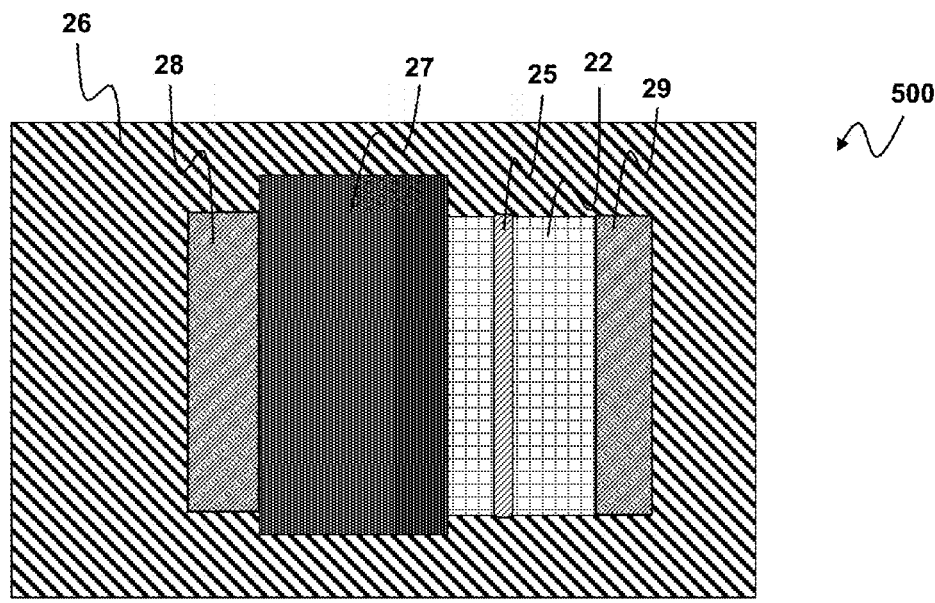

Please refer to FIGS. 5A and 5B for a fourth embodiment according to the present invention. FIG. 5A shows a schematic diagram of a cross-sectional view of a high voltage device 500. FIG. 5B shows a schematic diagram of a top view of the high voltage device 500. The high voltage device 500 of this embodiment has a structure similar to the first embodiment, but is different from the high voltage device 200 of the first embodiment in that, in this embodiment, the body region 26 surrounds and encloses the well 22. This embodiment indicates a different arrangement of the body region 26 and well 22 as compared to the first embodiment. Other parts of the structure are the same as the first embodiment, and details thereof are omitted here.

Figure 6A:
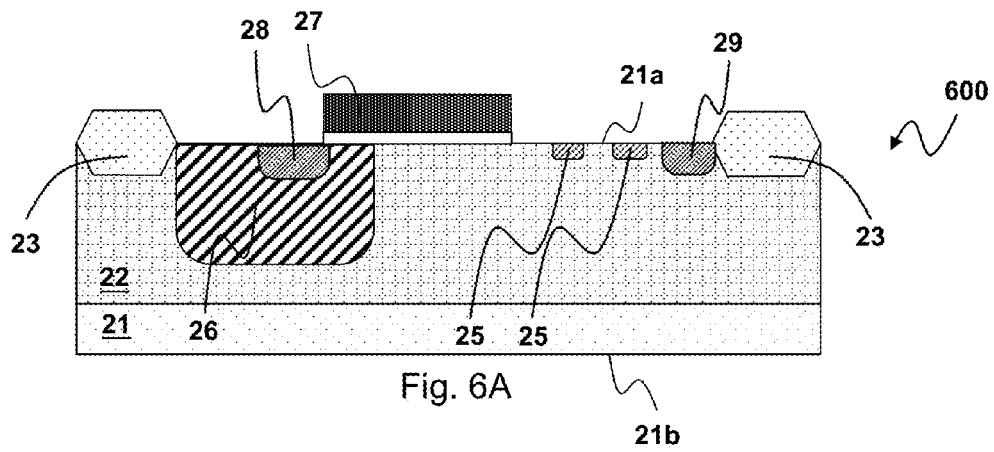

Please refer to FIGS. 6A and 6B for a fifth embodiment according to the present invention. FIG. 6A shows a schematic diagram of a cross-sectional view of a high voltage device 600. FIG. 6B shows a schematic diagram of a top view of the high voltage device 600. The high voltage device 600 of this embodiment has a structure similar to the first embodiment, but is different from the high voltage device 200 of the first embodiment in that, in this embodiment, the high voltage device 600 includes plural LDD regions 25. This embodiment indicates that the number of the LDD regions 25 may be plural as shown in FIGS. 6A and 6B as compared to the first embodiment. Other parts of the structure are the same as the first embodiment, and details thereof are omitted here.

Please refer to FIG. 7 for a sixth embodiment according to the present invention. FIG. 7 shows a schematic diagram of a cross-sectional view of a high voltage device 700. The high voltage device 700 of this embodiment has a structure similar to the high voltage device 400 in the third embodiment, but is different from the high voltage device 400 of the third embodiment in that, in this embodiment, the high voltage device 700 further includes a lightly doped well 22a. The lightly doped well 22a includes for example but not limited to N-type conductive type. The lightly doped well 22a is formed beneath the top surface 21a in the device region 23a, and two lateral sides of the lightly doped well 22a (two sides of the lightly doped well 22a in the lateral direction) are in direct contact with the well 22, wherein an impurity concentration of the N-type lightly doped well 22a is lower than an impurity concentration of the N-type well 22. According to the present invention, the number of the lightly doped well 22a may be varied; i.e., there can be plural lightly doped wells 22a. The lightly doped well 22a for example may be formed by masking the defined region of the lightly doped well 22a from the N-type impurities implanted in an ion implantation process for forming the well 22, such that the impurity concentration of the N-type lightly doped well 22a is lower than the impurity concentration of the N-type well 22. In this way, the lightly doped well 22a can be formed without any additional lithography and implantation processes, and the manufacturing cost is not increased. Other parts of the structure are the same as the third embodiment, and details thereof are omitted here.

FIG. 8 shows a schematic diagram of characteristics of the prior art high voltage device and the high voltage device according to the present invention, and it can be seen from the figure that the breakdown voltage of the high voltage device according to the present invention is significantly higher.

Figure 9A:
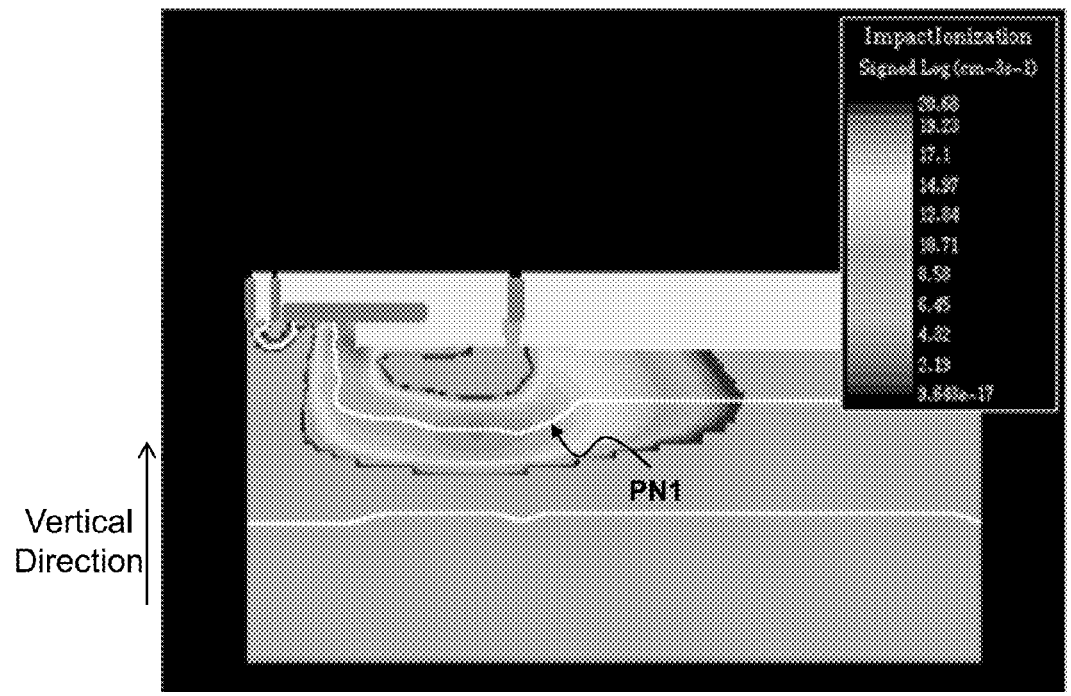
FIGS. 9A and 9B show electron impact ionization schematic diagrams of the high voltage devices according to the prior art and the present invention, respectively.
Figure 9B:
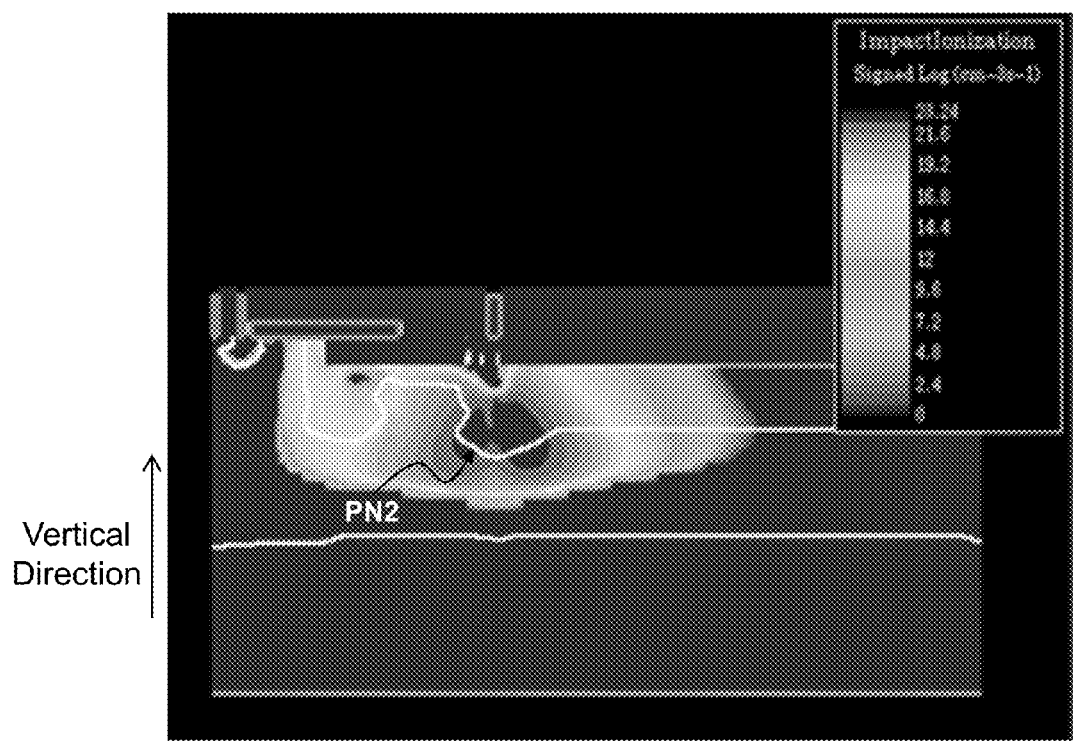

FIGS. 9A and 9B show electron impact ionization schematic diagrams of the high voltage devices according to the prior art and the present invention, respectively. As shown in FIGS. 9A and 9B, under an OFF operation, the prior art high voltage device forms a PN junction PN1 in the device region while the present invention forms a PN junction PN2 in the device region, and the PN junction PN2 is higher than the PN junction PN1 in the vertical direction, i.e., the PN junction PN2 according to the present invention is closer to the top surface, and therefore it is easier to generate a depletion region in the present invention, to mitigate (reduce) the electric field in the OFF operation, so the high voltage device according to the present invention can withstand a relatively higher voltage, i.e., the breakdown voltage is increased.

Note that, preferably, the LDD region 25 is completely not located right below the gate 27 in all the aforementioned embodiments. That is, any portion of the LDD region 25 does not overlap the gate 27 from the top view. Furthermore, according to one embodiment of the present invention, the LDD region 25 is floating in the ON operation and the OFF operation of the high voltage device.

The present invention has been described in considerable detail with reference to certain preferred embodiments thereof. It should be understood that the description is for illustrative purpose, not for limiting the scope of the present invention. Those skilled in this art can readily conceive variations and modifications within the spirit of the present invention. For example, other process steps or structures which do not affect the primary characteristic of the device, such as a deep well region, etc., can be added; for another example, the lithography process described in the above can be replaced by electron beam lithography or other lithography techniques. For another example, the conductive types of the P-type and the N-type of all the embodiments are interchangeable, to form a different type of high voltage device. For another example, it is not limited for each of the embodiments described hereinbefore to be used alone; under the spirit of the present invention, two or more of the embodiments described hereinbefore can be used in combination. For example, two or more of the embodiments can be used together, or, a part of one embodiment can be used to replace a corresponding part of another embodiment. For example, the lightly doped well 22a can be formed in all the other embodiments, etc. In view of the foregoing, the spirit of the present invention should cover all such and other modifications and variations, which should be interpreted to fall within the scope of the following claims and their equivalents. An embodiment or a claim of the present invention does not need to achieve all the objectives or advantages of the present invention. The title and abstract are provided for assisting searches but not for limiting the scope of the present invention.

What is claimed is:

1. A high voltage device, comprising:
a semiconductor substrate, which includes a top surface and a bottom surface opposite to the top surface in a vertical direction;
an isolation structure, which is formed on the top surface of the semiconductor substrate to define a device region;
a gate, which is formed on the top surface of the semiconductor substrate in the device region;
a body region with a first conductive type, which is formed in the device region beneath the top surface of the semiconductor substrate, and a part of the body region is located right below the gate;
a well with a second conductive type, which is formed below the top surface of the semiconductor substrate in the device region, and directly connects the body region in a lateral direction to form a junction, wherein the junction is located right below the gate;

a source and a drain, with the second conductive type, which are formed beneath the top surface of the semiconductor substrate in the device region, and are located respectively at two lateral sides of the gate, relatively nearer and farther to the body region respectively, wherein the drain and the gate are separated by the well; and a lightly doped diffusion (LDD) region with the first conductive type, which is formed beneath the top surface above the well in the device region, wherein the LDD region is located between the gate and the drain in the lateral direction, and the LDD region is not in direct contact with the drain.

2. The high voltage device of claim 1, further comprising a field oxide region, which is formed on the top surface in the device region, wherein a part of the field oxide region is located right below the gate, and other parts of the field oxide region are located between the gate and the drain.

3. The high voltage device of claim 2, wherein two sides of the LDD region in the lateral direction are aligned with the field oxide region.

4. The high voltage device of claim 2, wherein a depth of the LDD region as measured from the top surface downward along the vertical direction is not deeper than the field oxide region from a cross-sectional view.

5. The high voltage device of claim 1, further comprising a lightly doped well with the second conductive type, which is formed beneath the top surface in the device region, and two sides of the lightly doped well in the lateral direction are in direct contact with the well, wherein an impurity concentration of the second conductive type of the lightly doped well is lower than an impurity concentration of the second conductive type of the well.

6. The high voltage device of claim 1, wherein the LDD region is completely not located right below the gate.

7. The high voltage device of claim 1, wherein the LDD region is floating in an ON operation and an OFF operation of the high voltage device.

8. A manufacturing method of a high voltage device, comprising:

providing a semiconductor substrate, which includes a top surface and a bottom surface opposite to the top surface in a vertical direction;

forming an isolation structure on the top surface of the semiconductor substrate to define a device region;

forming a gate on the top surface of the semiconductor substrate in the device region;

forming a body region with a first conductive type, in the device region beneath the top surface of the semiconductor substrate, wherein a part of the body region is located right below the gate;

forming a well with a second conductive type, below the top surface of the semiconductor substrate in the device region, which directly connects the body region in a lateral direction to form a junction, wherein the junction is located right below the gate;

forming a source and a drain, with the second conductive type, which are formed beneath the top surface of the semiconductor substrate in the device region, and are located respectively at two lateral sides of the gate, relatively nearer and farther to the body region respectively, wherein the drain and the gate are separated by the well;

forming a lightly doped diffusion (LDD) region with the first conductive type, which is formed beneath the top surface above the well in the device region, wherein the LDD region is located between the gate and the drain, and the LDD region is not in direct contact with the drain.

9. The manufacturing method of claim 8, further comprising forming a field oxide region on the top surface in the device region, wherein a part of the field oxide region is located right below the gate, and other parts of the field oxide region are located between the gate and the drain.

10. The manufacturing method of claim 9, wherein two sides of the LDD region in the lateral direction are aligned with the field oxide region.

11. The manufacturing method of claim 9, wherein a depth of the LDD region as measured from the top surface downward along the vertical direction is not deeper than the field oxide region from a cross-sectional view.

12. The manufacturing method of claim 8, further comprising forming a lightly doped well with the second conductive type, beneath the top surface in the device region, wherein two sides of the lightly doped well in the lateral direction are in direct contact with the well, wherein an impurity concentration of the second conductive type of the lightly doped well is lower than an impurity concentration of the second conductive type of the well.

13. The manufacturing method of claim 8, wherein the LDD region is completely not located right below the gate.

14. The manufacturing method of claim 8, wherein the LDD region is floating in an ON operation and an OFF operation of the high voltage device.

* * * * *